United States Patent [19]

Kobayashi

[11] Patent Number: 4,882,502

[45] Date of Patent: Nov. 21, 1989

[54] INTEGRATED CIRCUIT FOR CONTROLLING THE LOADS OF AUTOMOBILE CIRCUITRY

[75] Inventor: Yoshinobu Kobayashi, Osaka, Japan

[73] Assignee: Sumitomo Electric Industries, Ltd., Osaka, Japan

[21] Appl. No.: 207,792

[22] Filed: Jun. 17, 1988

[30] Foreign Application Priority Data

Jun. 17, 1987 [JP] Japan .................... 62-149273

[51] Int. Cl.$^4$ .............. H03K 17/56; H03K 3/01; H03L 5/00; H03H 7/20
[52] U.S. Cl. ................... 307/247.1; 307/270; 307/264; 307/451; 307/480; 307/10.1; 307/571; 328/63; 328/72
[58] Field of Search ............... 307/247.1, 270, 264, 307/451, 443, 571, 573, 480, 10 R; 328/8, 63, 72, 34

[56] References Cited

U.S. PATENT DOCUMENTS

| | | | |
|---|---|---|---|
| 4,375,610 | 3/1983 | Nagaoka et al. | 307/10 R |
| 4,438,352 | 3/1984 | Mardkha | 307/451 |
| 4,680,487 | 7/1987 | Kobayashi | 307/451 |

Primary Examiner—Stanley D. Miller
Assistant Examiner—Trong Quang Phan
Attorney, Agent, or Firm—Cushman, Darby & Cushman

[57] ABSTRACT

An integrated circuit in which the effective power consumed by the pull-up resistor of a switch for controlling the loads of electrical circuitry of an automobile is reduced by passing the current through the pull-up resistor in synchronization with the duration of the pulse width of an input latching pulse only when the latching pulse is supplied. The integrated circuit thus may be powered by a regulated power supply due to its lower power consumption. Also, a surge arrester circuit is no longer required, thereby making it possible to reduce the size of the integrated circuit. The integrated circuit configured in this manner outputs a signal indicative of the on/off status of the switch without draining the battery due to the excess current which passes through the pull-up resistors in corresponding integrated circuits of the prior art.

5 Claims, 2 Drawing Sheets

INTEGRATED CIRCUIT FOR CONTROLLING THE LOADS OF AUTOMOBILE CIRCUITRY

BACKGROUND OF THE INVENTION

1. Field of the Invention

The present invention relates to an integrated circuit for automobiles. More particularly, the present invention relates to an integrated circuit which controls the loads of electric apparatuses such as motors and lamps of an automobile by judging the "on/off" status of a control signal for switching the loads.

2. Description of the Prior Art

An integrated circuit for automobiles has been previously employed which operates, for example, to control the movement of a windshield wiper by judging an "on/off" status of a signal from the switch is illustrated in FIG. 1. As shown in FIG. 1, the integrated circuit (10) judges the "on/off" status of a signal from the switch (20) so as to supply a control signal to be inputted to a driver circuit for driving the windshield wipers (not shown). The integrated circuit (10) comprises a C-MOS inverter (13) which consists of a p-channel type MOSFET (11) and an n-channel type MOSFET (12), a couple of diodes (14) and (15) which regulate the input voltage so that it is within a predetermined range so as to protect the aforesaid C-MOS inverter (13), a protection resistor (19), a D flip-flop (16) which functions as an input register for the driver circuit, an inverter (17) and an input latching pulse generating circuit (21) for providing a latch pulse to inverter (17).

In the circuit of FIG. 1, a pull-up resistor (30) is also employed to adjust the voltage of the "on/off" signal from switch (20) in order to match it to the level which can be input to the integrated circuit (10). Since the pull-up resistor (30) is required to continuously pass the current $I_1$ while the switch (20) is "on", it cannot be connected to the regulated power supply (40) "Vcc" of the integrated circuit (10), for power supply (40) does not have enough capacity. Pull-up resistor (30) instead should be directly connected to the battery (B) of the automobile or indirectly connected to the battery through the ignition switch (not shown). Finally, between the input electrode (18) of the integrated circuit (10) and the pull-up resistor (30), a surge protection circuit (50) comprised of a diode (51), a capacitor (52) and a resistor (53) with a high resistance value is inserted as shown to protect the integrated circuit from battery surges.

Hereinafter, the operating process of the prior art integrated circuit (10) of FIG. 1 will be explained with reference to the time chart of FIG. 2. The indicated voltages and currents correspond to those at the similarly labelled portions of the diagram of FIG. 1.

I: Operating process from time t1 to the time just before time t3:

At time t1, when the switch (20) is turned from "off" to "on" (FIG. 2(1)), a current "$I_1$" is input through the pull-up resistor (30) (FIG. 2(3)) and the signal "V1" to be input to the integrated circuit (10) falls down from a "high level" (hereafter referred to as "H") to a "low level" (hereafter referred to as "L") (FIG. 2(4)). Due to this change, the p-channel type MOSFET (11) is turned "on", and the n-channel type MOSFET (12) is turned "off". The signal for the input "D" of D flip-flop (16) ($V_2$) is raised to "H" (FIG. 2(5)). Then, at time t2, a positive input latching pulse (FIG. 2(2)) which is supplied by the input latching pulse generating circuit (21) has its polarity changed by inverter (17) and is inputted to the clock input "CLK" of D flip-flop (16). The output signal "V3" which is supplied from the output $\overline{Q}$ then falls down to "L" in synchronization with the trailing edge of the input latching pulse (FIG. 2(6)). After time t2, the signal "V3" which is supplied from the output "$\overline{Q}$" is continuously maintained at "L".

II: Operating process from time t3 to time t4:

At time t3, the switch (20) is turned from "on" to "off" (FIG. 2(1)) and the current "$I_1$" which has been passing through the pull-up resistor (30) is stopped (FIG. 2(3)). The input signal "V1" also rises from "L" to "H" (FIG. 2(4)). Due to this change, the p-channel type MOSFET (11) is turned "off" and the n-channel type MOSFET (12) is turned "on", and the signal "V2" thus falls down to "L" (FIG. 2(5)). The signal "V3" from the $\overline{Q}$ output of the D flip-flop (16) is maintained at "L" (FIG. 2(6)). Then, at time t4 the signal "V3" rises up from "L" to "H" in synchronization with the trailing edge of the input latching pulse which is supplied to the clock "CLK" of D flip-flop (16) (FIGS. 2(2) and 2(6)).

As indicated above, the integrated circuit (10) in the prior art circit of FIG. 1 judges the "on/off" status of a signal from the switch (20) and accordingly operates a driver circuit (not shown) of the windshield wipers by a "L" level of the signal "V3". However, such an integrated circuit of the prior art has the following problems:

1. Due to the treatment of current leakage while the switch (20) is "off", the resistance for the pull-up resistor (30) cannot be selected to be large enough. A smaller resistance causes a larger current to pass through the aforementioned pull-up resistor (30) while the switch (20) is "on". Moreover, the effective power to be consumed through this process is much lager when the ignition key is turned "off"; therefore, the vehicle battery is frequently drained.

2. To protect the integrated circuit from surge voltage such as ignition noises or loading-dumping pulses, a surge protection circuit (50) must be used. Surge protection circuit (50) increases the production costs and occupies much space. In fact, the space for the surge protection circuit (50) is much wider than that required for the integrated circuit (10) itself.

SUMMARY OF THE INVENTION

An object of the present invention is to solve the above-mentioned problems by providing an integrated circuit for automobiles in which the power consumption by the pull-up resistor is small and in which a surge protection circuit is not required.

To solve the above-mentioned problems in the prior art, the integrated circuit of the present invention is designed to operate the external loads of electric apparatuses of an automobile and comprises:

a p-channel type MOSFET whose source electrode is connected to a regulated power supply and whose gate electrode is supplied with an input latching pulse which is produced by a pulse generating circuit;

a pull-up resistor which is connected between the drain electrode of the p-channel type MOSFET and an input electrode to which an "on/off" signal is supplied from a switch operating the external loads of the electric apparatuses;

an inverter which changes the polarity of a positive input latching pulse from the pulse generating circuit so as to supply a negative pulse to the gate electrode of the p-channel type MOSFET in order to operate it to be "on" only when the input latching pulse is spplied; and a register comprised of a flip-flop which latches the on/off signal using the input latching pulse which is supplied from the inverter as a voltage signal.

In these drawing figures, (20) is a switch, (100) is an integrated cirdcuit, (113) is a C-MOS inverter, (116) is a D flip-flop, (118) is a p-channel type MOSFET and (119) is a pull-up resistor.

DESCRIPTION OF THE PREFERRED EMBODIMENTS

The following is a detailed description of the present preferred embodiment of the invention with one example and figure. However, it is to be understood that the following example is given merely to aid in the understanding of the present invention, and variations may be made by one skilled in the art without departing from the spirit and scope of the present invention.

Figure 1:
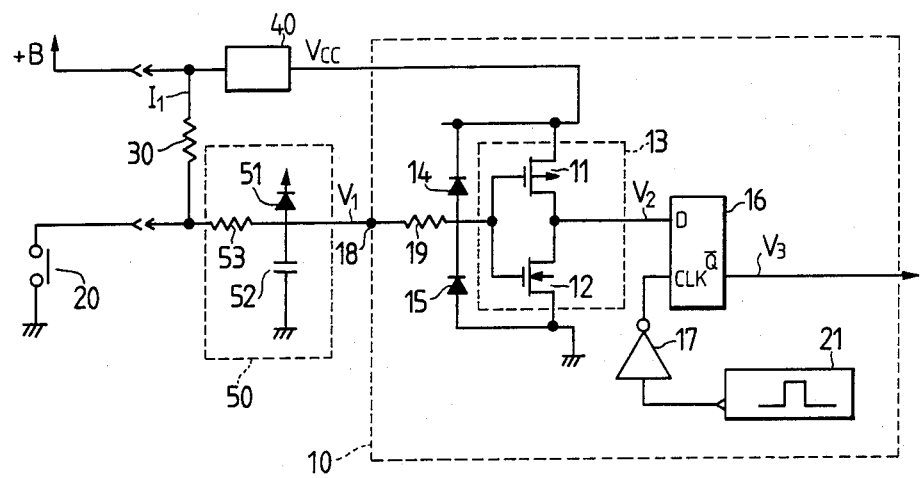
FIG. 1 is a circuit diagram which illustrates an example of the integrated circuit of the prior art.
Figure 2:
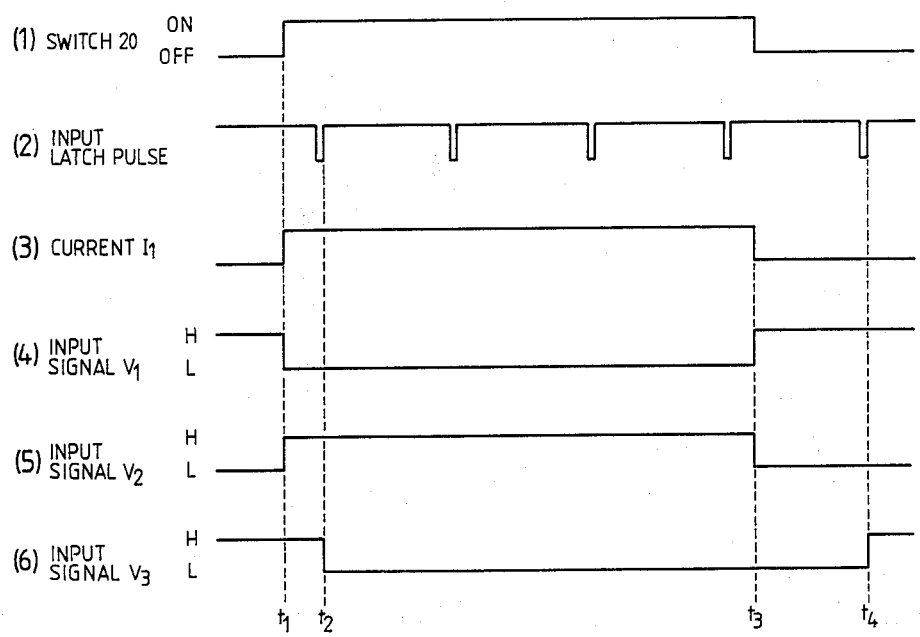
FIG. 2 is a time chart which demonstrates the operating process of the integrated circuit of the prior art.
Figure 3:
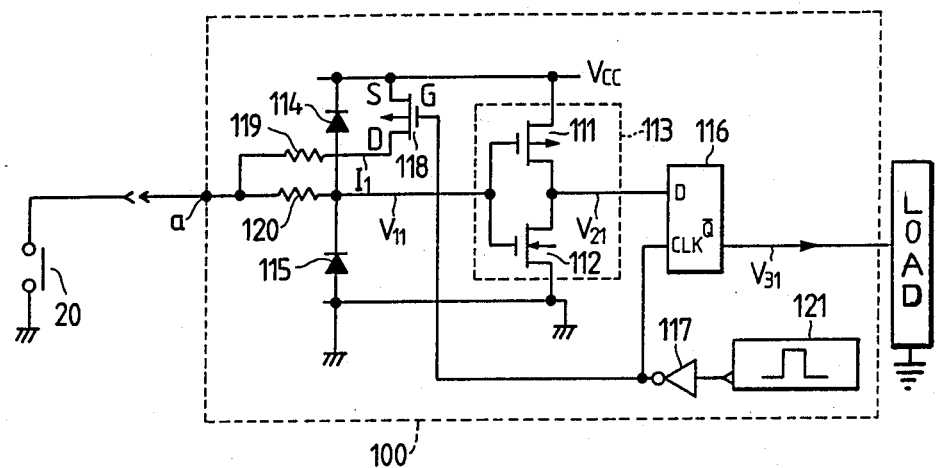
FIG. 3 is a circuit diagram which illustrates one example of the integrated circuit of the present invention.

One example of an integrated circuit of the present invention which judges the "on/off" status of a signal from a switch and which controls the movement of windshield wipers, for example, is illustrated in FIG. 3. The integrated circit (100) judges the "on/off" status of a signal from the switch (20) and produces a signal to be input to a driver circuit for the windshield wipers (not shown). As shown in FIG. 3, integrated circuit (100) comprises a C-MOS inverter (113) which consists of a p-channel type MOSFET (111) and an n-channel type MOSFET (112), a couple of diodes (114) and (115) which regulate the input voltage to the C-MOS inverter (113) so as to be within a predetermined range, a D flip-flop (116) as an input register for the driver circuit, an inverter (117), a pulse generating circuit (121) for latching the input signal after inversion by inverter (117), a p-channel type MOSFET (118) and a pull-up resistor (119).

As shown, pull-up resistor (119) is connected between the drain electrode "D" of the MOSFET (118) and the input electrode "a" of the integrated circuit (100) to which an "on/off" signal from the switch (20) is input. The regulated power supply "Vcc" is connected to the source electrode "S" of the MOSFET (118), and also the latching pulse generating circuit (121) is connected through the inverter (117) to the gate electrode "G" of the MOSFET (118). Also, a matching resistor (120) is employed to adjust the level of the input signal at input electrode "a".

Hereinafter, the operating process of the integrated circuit (100) of the present invention will be explained with reference to FIG. 3 and the time chart of FIG. 4.

Figure 4:
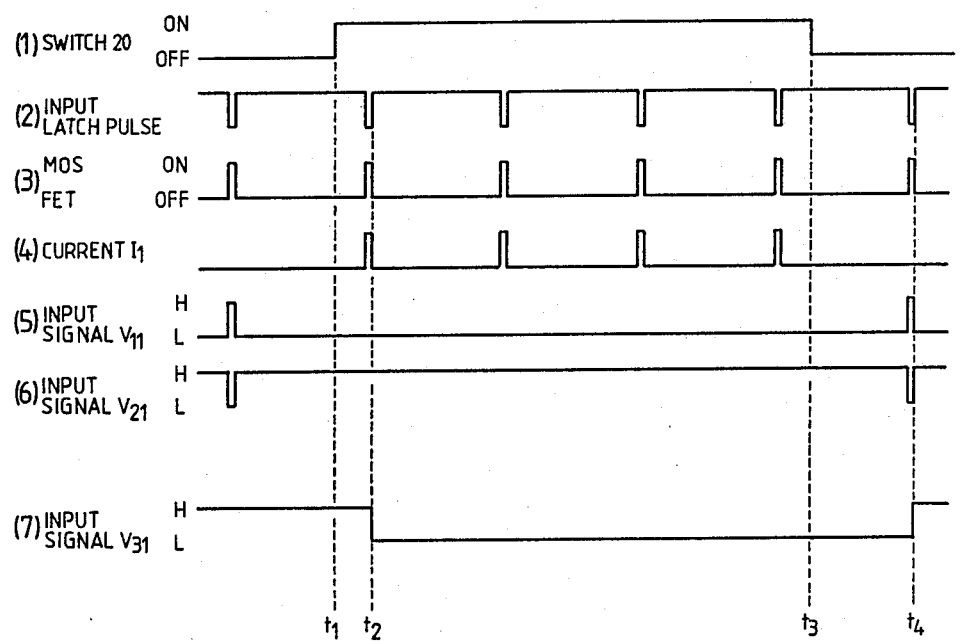
FIG. 4 is a time chart which demonstrates the operating process of the integrated circuit of the present invention.

I: Operating process from time t1 to the time just before time t3:

At time t1, when the switch (20) is turned from "off" to "on" (FIG. 4(1)), since the input latching pulse is not supplied from the input latching pulse generating circuit (121) the MOSFET (118) is maintained in its "off" state, and no current passes through pull-up resistor (119). Then, at time t2, a positive input latching pulse (FIG. 4(2)) which is supplied from the input latching pulse generating circuit (121) has its polarity changed by inverter (117) (FIG. 4(3)). The inverted input latching pulse is then input to the gate electrode "G" of MOSFET (118) and at the same time to clock input "CLK" of D flip-flop (116). Due to this change, the voltage of the gate electrode "G" of MOSFET (118) changes to "L" and changes its status to "on", and the current "$I_1$" passes through the pull-up resistor (119) (FIG. 4(4)). Though these processes are introduced to the integrated circuit (100), the input signal "V11" which is supplied to the C-MOS inverter (113) is short-circuited to ground and is maintained at "L" while the switch (20) is "on" (FIG. 4(5)). Hence, the p-channel type MOSFET (111) is turned "on" and n-channel type MOSFET (112) is turned "off", and the signal "V21" to be supplied to the input electrode "D" of the D flip-flop (116) is thus changed to "H" (FIG. 4(6)). Then, signal "V31" which is supplied from the output $\overline{Q}$ of D flip-flop (116) falls down to "L" in synchronization with the trailing edge of the input latching pulse (FIG. 4(7)). After time t2, as current $I_1$ is introduced to the pull-up resistor (119) from the MOSFET (118), whose status is turned "on" only when the input latching pulse is supplied from the latching pulse generating circuit (121), the signal "V31" which is supplied from the output $\overline{Q}$ is input to the external load and continuously maintained at "L".

II: Operating process from time t3 to time t4:

At time t3, when the switch (20) is turned from "on" to "off" (FIG. 4(1)), the input signal "V31" is maintained at "L" until the next latching pulse is supplied (FIG. 4(7)). Then, at time t4, when the input latching pulse has been supplied from the input latching pulse generating circuit (121), the MOSFET (118) is turned "on". Also, the signal "V21" to be input to the D flip-flop (116) is changed to "H" because the switch (20) is now "off", and the input signal "V11" is connected to the regulated power supply "Vcc" through the MOSFET (118), the pull-up resistor (119) and the matching resistor (120) (FIG. 4(5)). These changes turn the p-channel type MOSFET (111) "off" and n-channel type MOSFET (112) "on"; therefore, the signal "V21" which is supplied to the input electrode "D" of the D flip-flop (116) is changed to "L" (FIG. 4(6)) and the signal "V31" which is supplied from the output $\overline{Q}$ rises from "L" to "H" in synchronization with the trailing edge of the input latching pulse (FIGS. 4(2) and 4(7)).

As indicated above, the integrated circuit (100) judges the "on/off" status of a signal from the switch (20) and operates the driver circuit (not shown) of the windshield wipers using the signal V31. It is thus unnecessary to check continuously the status of the signal from switch (20). For example, it is sufficient to check the signal from switch (20) in synchronization with the duration of the pulse width of the latching pulse, which may have a frequency of 10 msec and a pulse width of 0.1 msec. (a duty ratio of 1/100). Accordingly, the effective power to be consumed across the pull-up resistor is very low even when the resistance of the pull-up resistor is not so large.

In a modification of this embodiment, the resistance between the drain electrode of the MOSFET (118) and the source electrode "S" may be applicable instead of the pull-up resistor (119) for the integrated circuit of the present invention.

The present invention thus constructed provides the following advantages:

In accordance with the first aspect of the invention, as was explained in the example, an integrated circuit is provided which reduces the effective power to be consumed by the pull-up resistor because current passes through the pull-up resistor in synchronization with the duration of the pulse width only when an input latching pulse is supplied.

In accordance with another aspect of the invention, an inegrated circuit is provided which is free from surge voltage because the integrated circuit need not be directly connected to the battery of the automobile or indirectly connected to the battery through the ignition switch. Thus, the integrated circuit can be powered by a regulated power supply due to its lower power consumption. Consequently, a surge arrestor circuit is not required in the present invention, making it possible to significantly reduce the circuit size.

What is claimed is:

1. An integrated circuit for judging the on/off status of a control signal for switching a load, comprising:
   a switch which generates said control signal for switching said load;
   a regulated power supply;
   latch pulse generating means for generating an input latching pulse at an output thereof;
   a p-channel type MOSFET whose source electrode is connected to said regulated power supply and whose gate electrode receives said input latching pulse from said output of said latch pulse generating means;
   a pull-up resistor connected between a drain electrode of said p-channel type MOSFET and one side of said switch for receiving said control signal from said switch, said pull-up resistor only being operative when said p-channel type MOSFET is activated by said input latching pulse applied to said gate electrode; and
   a register, which receives said control signal from said one side of said switch at a first input and said input latching pulse at a second input, for latching said control signal from said switch in response to said input latching pulse and for outputting said latched control signal to control switching of said load.

2. An integrated circuit as in claim 1, further comprising an inverter connected to said output of said latch pulse generating means for inverting said input latching pulse before said input latching pulse is applied to the gate electrode of said p-channel type MOSFET so that said p-channel type MOSFET is only activated when said inverted input latching pulse is supplied.

3. An integrated circuit as in claim 1, further comprising a matching resistor connected between said one side of said switch and said first input of said register for adjusting a level of said control signal.

4. An integrated circuit as in claim 1, wherein said register is a D flip-flop and said latched control signal represents the on/off status of said load.

5. An integrated circit as in claim 1, wherein said load is the electrical circuitry of an automobile.

* * * * *